US008803330B2

(12) United States Patent
Huang et al.

(10) Patent No.: US 8,803,330 B2
(45) Date of Patent: Aug. 12, 2014

(54) INTEGRATED CIRCUIT PACKAGE SYSTEM WITH MOUNTING STRUCTURE

(75) Inventors: Rui Huang, Singapore (SG); Seng Guan Chow, Singapore (SG); Heap Hoe Kuan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 1066 days.

(21) Appl. No.: 12/239,774

(22) Filed: Sep. 27, 2008

(65) Prior Publication Data
US 2010/0078828 A1   Apr. 1, 2010

(51) Int. Cl.
*H01L 23/48* (2006.01)
*H01L 23/52* (2006.01)
*H01L 29/40* (2006.01)

(52) U.S. Cl.
USPC .......................................... 257/777; 257/778

(58) Field of Classification Search
CPC ............... H01L 2224/081; H01L 2224/08145; H01L 2224/08135
USPC ................................................... 257/777, 778
See application file for complete search history.

(56) References Cited

U.S. PATENT DOCUMENTS

| 5,973,396 | A | * | 10/1999 | Farnworth | 257/698 |
| 6,444,576 | B1 | | 9/2002 | Kong | |
| 6,908,785 | B2 | | 6/2005 | Kim | |
| 7,026,709 | B2 | | 4/2006 | Tsai et al. | |
| 7,317,256 | B2 | | 1/2008 | Williams et al. | |
| 7,372,141 | B2 | * | 5/2008 | Karnezos et al. | 257/686 |
| 2007/0187826 | A1 | | 8/2007 | Shim et al. | |
| 2009/0014897 | A1 | * | 1/2009 | Ohno | 257/778 |

* cited by examiner

*Primary Examiner* — Jarrett Stark
(74) *Attorney, Agent, or Firm* — Ishimaru & Associates LLP

(57) ABSTRACT

An integrated circuit package system includes: providing a mountable structure having a contact pad and an inner pad; mounting an integrated circuit device having a linear through channel over the mountable structure with the linear through channel traversing between an integrated circuit device first side and an integrated circuit device second side; and connecting the linear through channel exposed on the integrated circuit device second side to the inner pad.

10 Claims, 4 Drawing Sheets

INTEGRATED CIRCUIT PACKAGE SYSTEM WITH MOUNTING STRUCTURE

TECHNICAL FIELD

The present invention relates generally to an integrated circuit package system and more particularly to an integrated circuit package system having a mounting structure.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package on package (POP).

Thus, a need still remains for an integrated circuit package system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system includes providing a mountable structure having a contact pad and an inner pad; mounting an integrated circuit device having a linear through channel over the mountable structure with the linear through channel traversing between an integrated circuit device first side and an integrated circuit device second side; and connecting the linear through channel exposed on the integrated circuit device second side to the inner pad.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
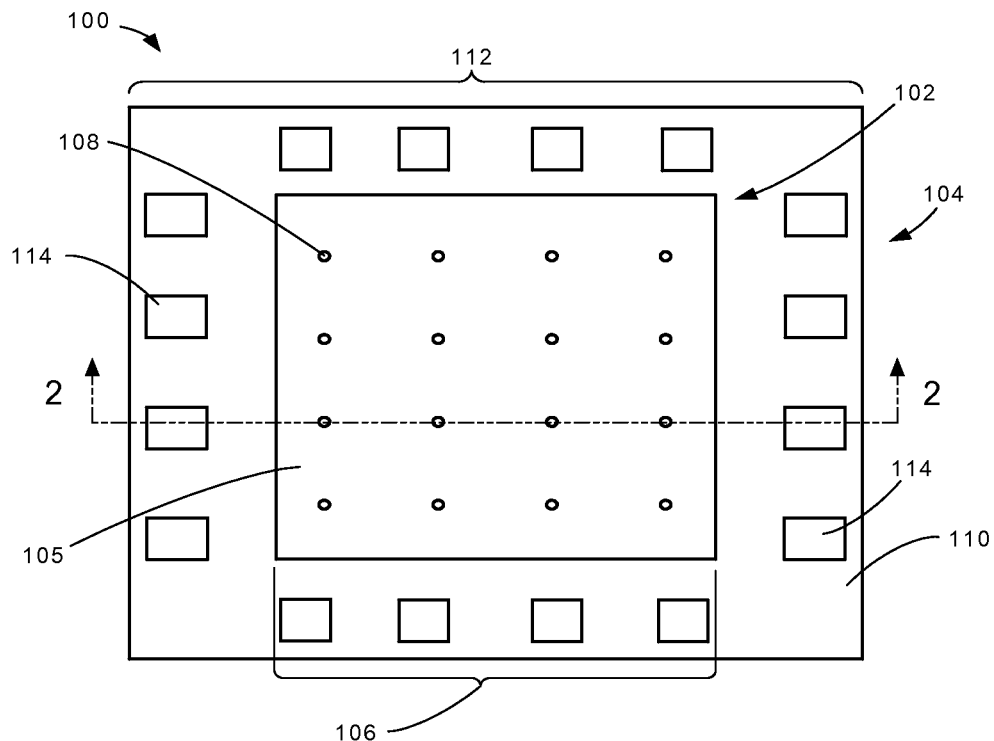
FIG. 1 is a top view of the integrated circuit package system 100 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package system 100 in a first embodiment of the present invention. The top view depicts an integrated circuit device 102, such as a stack of integrated circuit dies, mounted over a mountable structure 104, such as a substrate. The integrated circuit device 102 can have an integrated circuit device first side 105. The integrated circuit device first side 105 can provide a first level 106 of the integrated circuit package system 100. The integrated circuit device 102 can have mounting pads 108 exposed at the integrated circuit device first side 105.

The mountable structure 104 can have a mountable structure first side 110. The mountable structure first side 110 can provide a second level 112 of the integrated circuit package system 100. The mountable structure 104 can have contact pads 114 exposed from the mountable structure first side 110.

Figure 2:
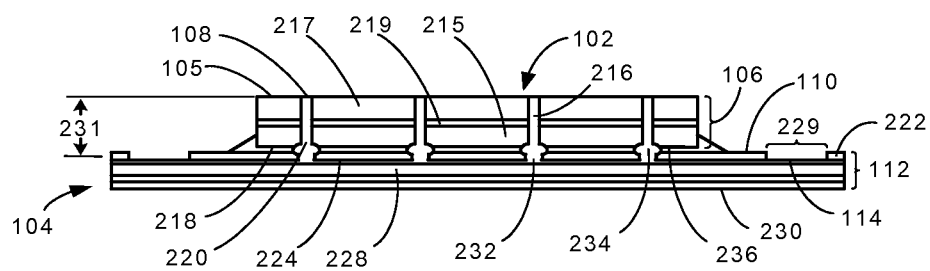
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The cross-sectional view depicts the integrated circuit device 102 as the first level 106 of the integrated circuit package system 100. The cross-sectional view also depicts the mountable structure 104 as the second level 112 of the integrated circuit package system 100.

The integrated circuit device 102 can be formed by a stack of devices. For example, the integrated circuit device 102 can include a first integrated circuit 215, such as an integrated circuit die, and a second integrated circuit 217, such as an integrated circuit die, mounted over the first integrated circuit 215. An insulator 219, such as a dielectric layer, can be between the first integrated circuit 215 and the second integrated circuit 217.

The integrated circuit device 102 can have linear through channels 216, such as a through silicon via, connecting the integrated circuit device first side 105 to an integrated circuit device second side 218 of the integrated circuit device 102. The linear through channels 216 can traverse between the integrated circuit device first side 105 and the integrated circuit device second side 218 in a direct, linear, and continuous fashion. In at least one embodiment, the integrated circuit device first side 105 and the integrated circuit device second side 218 can be located along the outermost boundaries of the exterior of the integrated circuit device 102.

For illustrative purposes, the integrated circuit package system 100 includes the linear through channels 216 in a vertical configuration between the integrated circuit device first side 105 and the integrated circuit device second side 218, although it is understood that the integrated circuit package system 100 can have the linear through channels 216 in a different configuration. For example, the linear through channels 216 can be in an obtuse angle between the integrated circuit device first side 105 and the integrated circuit device second side 218.

The integrated circuit device 102 includes active circuitry (not shown) fabricated thereto. The active circuitry can be fabricated at the integrated circuit device first side 105 or the integrated circuit device second side 218.

The linear through channels 216 can be exposed on the integrated circuit device first side 105 forming the mounting pads 108. The integrated circuit device first side 105 can be used to mount additional devices that are not shown. The linear through channels 216 can be exposed on the integrated circuit device second side 218 forming interconnect pads 220.

The mountable structure 104 can include a protective layer 222, such as a solder mask, and a conductive layer 224, such as a routing trace, and an insulation layer 228. The conductive layer 224 can be over the insulation layer 228. The protective layer 222 can be over the conductive layer 224 and the insulation layer 228.

The contact pads 114 can be formed by exposing the conductive layer 224 through a hole 229 in the protective layer 222. For illustrative purposes, the mountable structure 104 is shown with the contact pads 114 exposed by the mountable structure first side 110. Although, it is understood that the mountable structure 104 can have the contact pads 114 exposed at a mountable structure second side 230 of the mountable structure 104. A channel height 231 is the distance between the contact pads 114 and the mounting pads 108 exposed at the integrated circuit device first side 105.

The integrated circuit device 102 can be mounted over and connected to the mountable structure 104. The interconnect pads 220 can be aligned with inner pads 232 of the mountable structure 104. The inner pads 232 can be exposed from the mountable structure first side 110 and below the integrated circuit device 102. The inner pads 232 can be used for connecting the mountable structure 104 and the integrated circuit device 102. A mounting interconnect 234, such a micro solder ball, a stud bump, or a solder bump, can connect the interconnect pads 220 and the inner pads 232.

The mounting interconnect 234 can connect the integrated circuit device 102 and the mountable structure 104 by a number of processes. For example, thermal compression bonding can be used to bond the inner pads 232 and the interconnect pads 220 with the mounting interconnect 234.

An underfill 236 can be between the integrated circuit device 102 and the mountable structure 104 forming a hermetic seal. The underfill 236 can surround the mounting interconnect 234 without covering or contaminating the contact pads 114.

Figure 3:
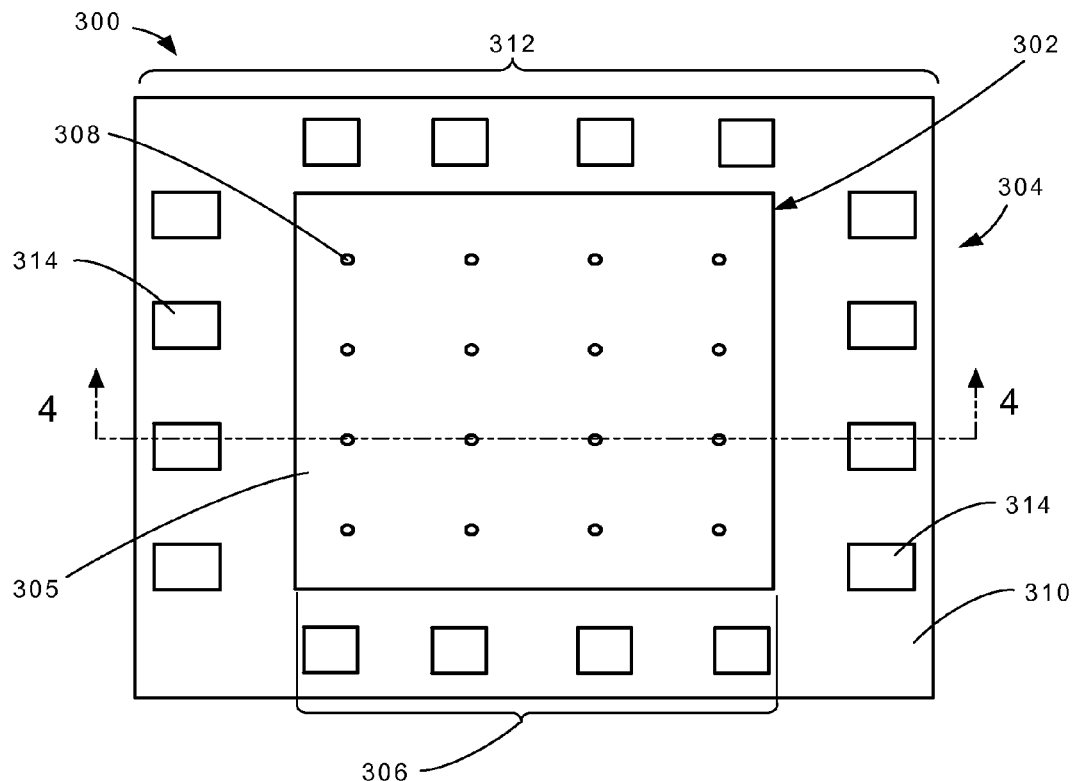
FIG. 3 is a top view of an integrated circuit package system 300 in a second embodiment of the present invention.

Referring now to FIG. 3, therein is shown a top view of an integrated circuit package system 300 in a second embodiment of the present invention. The top view depicts an integrated circuit device 302, such as an integrated circuit die, mounted over a mountable structure 304, such as an integrated circuit die or a semiconductor die. The integrated circuit device 302 can have an integrated circuit device first side 305. The integrated circuit device first side 305 can provide a first level 306 of the integrated circuit package system 300. The integrated circuit device 302 can have mounting pads 308 exposed at the integrated circuit device first side 305.

The mountable structure 304 can have a mountable structure first side 310. The mountable structure first side 310 can provide a second level 312 of the integrated circuit package system 300. The mountable structure 304 can have contact pads 314 exposed from the mountable structure first side 310.

Figure 4:
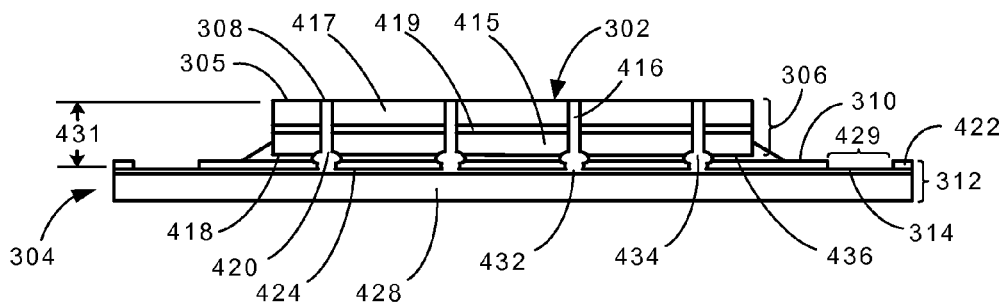
FIG. 4 is a cross-sectional view of the integrated circuit package system along line 4-4 of FIG. 3.

Referring now to FIG. 4, therein is shown a cross-sectional view of the integrated circuit package system 300 along line 4-4 of FIG. 3. The cross-sectional view depicts the integrated circuit device 302 as the first level 306 of the integrated circuit package system 300. The cross-sectional view also depicts the mountable structure 304 as the second level 312 of the integrated circuit package system 300.

The integrated circuit device 302 can be formed by a stack of devices. For example, the integrated circuit device 302 can include a first integrated circuit 415, such as an integrated circuit die, and a second integrated circuit 417, such as an integrated circuit die, mounted over the first integrated circuit 415. An insulator 419, such as a dielectric layer, can be between the first integrated circuit 415 and the second integrated circuit 417.

The integrated circuit device 302 can have linear through channels 416, such as a through silicon via, connecting the integrated circuit device first side 305 to an integrated circuit device second side 418 of the integrated circuit device 302. The linear through channels 416 can traverse between the integrated circuit device first side 305 and the integrated circuit device second side 418 in a direct, linear, and continuous fashion.

For illustrative purposes, the integrated circuit package system 300 includes the linear through channels 416 in a vertical configuration between the integrated circuit device first side 305 and the integrated circuit device second side 418, although it is understood that the integrated circuit package system 300 can have the linear through channels 416 in a different configuration. For example, the linear through channels 416 can be in an obtuse angle between the integrated circuit device first side 305 and the integrated circuit device second side 418.

The integrated circuit device 302 includes active circuitry (not shown) fabricated thereto. The active circuitry can be fabricated at the integrated circuit device first side 305 or the integrated circuit device second side 418.

The linear through channels 416 can be exposed on the integrated circuit device first side 305 forming the mounting pads 308. The integrated circuit device first side 305 can be used to mount additional devices that are not shown. The linear through channels 416 can be exposed on the integrated circuit device second side 418 forming interconnect pads 420.

The mountable structure 304 can include a protective layer 422, such as a passivation layer, a conductive layer 424, and a semiconductor die 428, such as a silicon substrate or an integrated circuit die. The conductive layer 424 can be over the semiconductor die 428. The protective layer 422 can be over the conductive layer 424 and the semiconductor die 428.

The contact pads 314 can be formed by exposing the conductive layer 424 through a hole 429 in the protective layer 422. A channel height 431 is the distance between the contact pads 314 exposed at the mountable structure first side 310 and the mounting pads 308 exposed at the integrated circuit device first side 305.

The integrated circuit device 302 can be mounted over and connected to the mountable structure 304. The interconnect pads 420 can be aligned with inner pads 432 of the mountable structure 304. The inner pads 432 can be exposed from the mountable structure first side 310 and below the integrated circuit device 302. The inner pads 432 can be used for connecting the mountable structure 304 and the integrated circuit device 302. A mounting interconnect 434, such a micro solder ball, a stud bump, or a solder bump, can connect the interconnect pads 420 and the inner pads 432.

The mounting interconnect 434 can connect the integrated circuit device 302 and the mountable structure 304 by a number of processes. For example, thermal compression bonding can be used to bond the inner pads 432 and the interconnect pads 420 with the mounting interconnect 434.

An underfill 436 can be between the integrated circuit device 302 and the mountable structure 304 forming a hermetic seal. The underfill 436 can surround the mounting interconnect 434 without covering or contaminating the contact pads 314.

Figure 5:
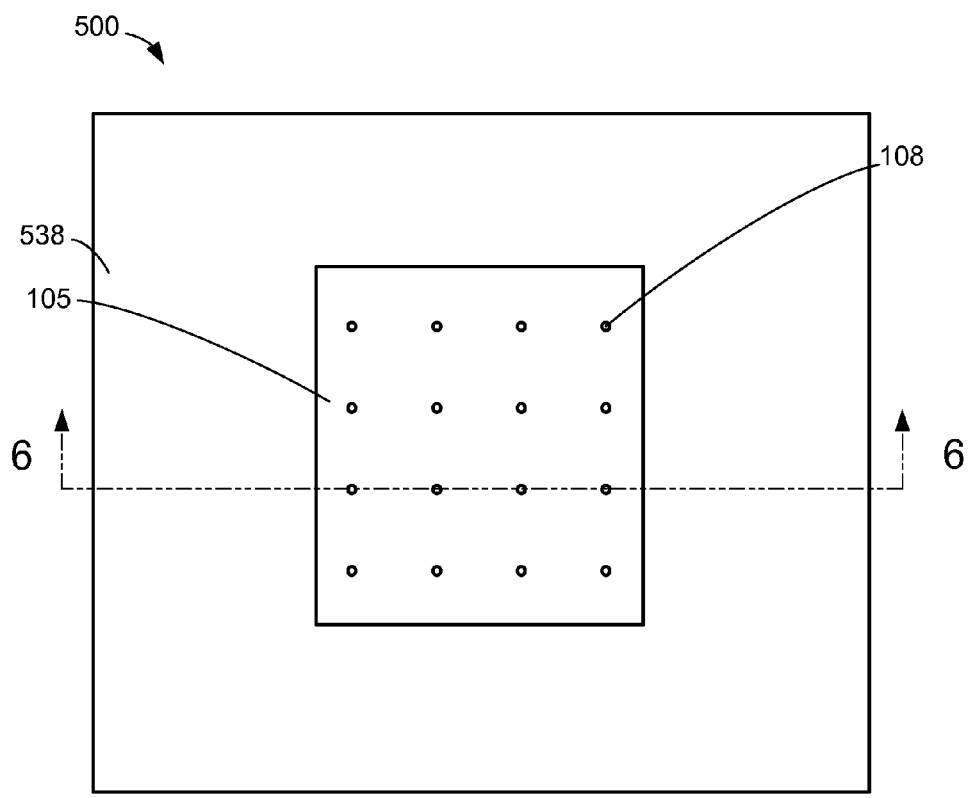
FIG. 5 is a top view of a package in package system 500 with a first example application of the integrated circuit package system 100 in a third embodiment of the present invention.

Referring now to FIG. 5, therein is shown a top view of a package in package system 500 with a first example application of the integrated circuit package system 100 in a third embodiment of the present invention. The top view depicts an encapsulation 538, such as a cover including an epoxy molding compound, with a portion of the integrated circuit package system 100 exposed. The exposed portion of the integrated circuit package system 100 can include the integrated circuit device first side 105 and the mounting pads 108.

Figure 6:
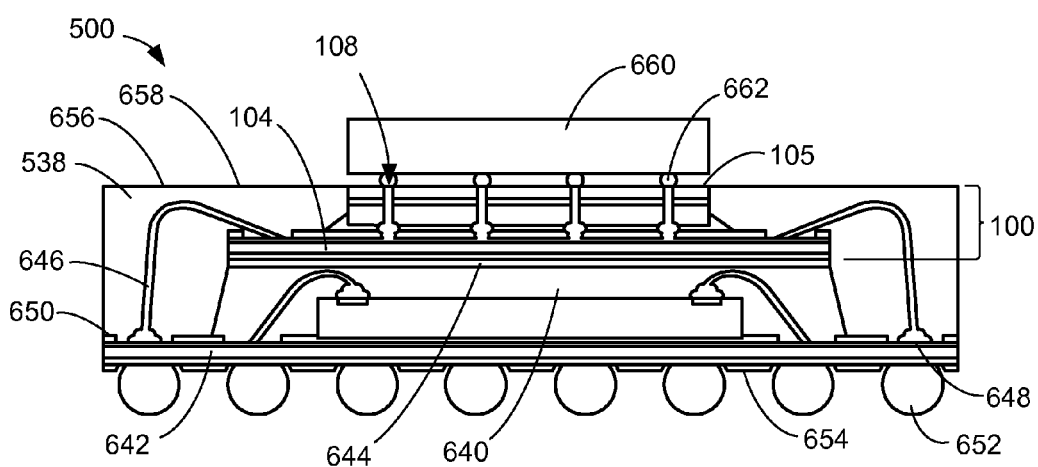
FIG. 6 is a cross-sectional view of the package in package system along line 6-6 of FIG. 5.

Referring now to FIG. 6, therein is shown a cross-sectional view of the package in package system 500 along line 6-6 of FIG. 5. A packaged module 640, such as a packaged integrated circuit, can be mounted over a carrier 642, such as a substrate. The integrated circuit package system 100 can be mounted over the packaged module 640 with an adhesive 644.

An internal interconnect 646, such as a bond wire or ribbon bond wire, can connect the carrier 642 to the mountable structure 104. The carrier 642 can have carrier pads 648 at a carrier first side 650. The internal interconnect 646 can connect between the contact pads 114 of the mountable structure first side 110 and the carrier pads 648. An external interconnect 652, such as a solder ball, can be connected to a carrier second side 654 of the carrier 642.

The encapsulation 538 can be over the carrier 642, the packaged module 640, the internal interconnect 646, and the integrated circuit package system 300 with the mounting pads 108 exposed. An encapsulation top side 656 of the encapsulation 538 can be planar with the integrated circuit device first side 105. The encapsulation top side 656 and the integrated circuit device first side 105 can form a package in package system top side 658.

The package in package system top side 658 can be used to mount a device 660, such as flip chip or a packaged integrated circuit. Device interconnects 662, such as solder balls or solder bumps, can connect the device 660 and the mounting pads 108 at the package in package system top side 658. For illustrative purposes, the encapsulation top side 656 is shown without connective means. However, it is understood that connective means, such as a thin film deposit, can be over the encapsulation top side 656 and connected to the mounting pads 108 exposed at the integrated circuit device first side 105.

It has been discovered that the present invention provides an integrated circuit package system with increased packaging density, thinner package profile and lowers manufacturing cost by providing two levels of connectivity. The second level or the lower level of connectivity enables manufactures to connect the integrated circuit package system to a base carrier, lowering the profile of the package in package system. An integrated circuit die having linear through channels or an integrated circuit device having through silicon vias provides a first level of the integrated circuit package system over the second level. Both levels provide electrical connection to the integrated circuit package system as well as to the second level or the lower level with the linear through channels. The integrated circuit package system can be tested prior to assembly, improving product yield.

Figure 7:
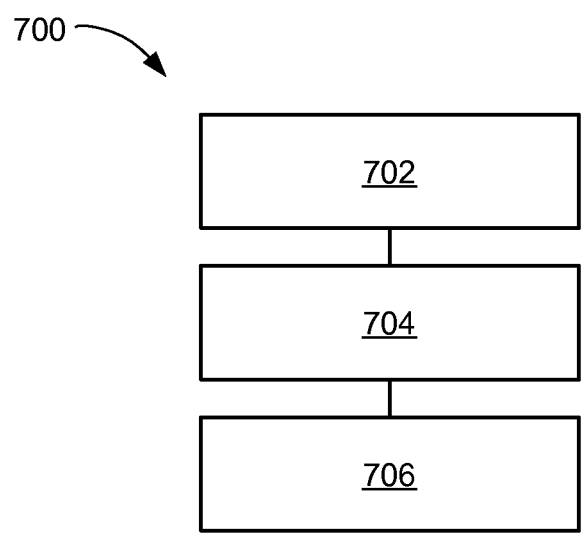
FIG. 7 is a flow chart of an integrated circuit package system for manufacture of the integrated circuit package system in an embodiment of the present invention.

Referring now to FIG. 7, therein is shown a flow chart of an integrated circuit package system 700 for a manufacture of the integrated circuit package system 100 in an embodiment of the present invention. The system 700 includes providing a mountable structure having a contact pad and an inner pad in a block 702; mounting an integrated circuit device having a linear through channel over the mountable structure with a linear through channel traversing between an integrated circuit device first side and an integrated circuit device second side in a block 704; and connecting the linear through channel exposed on the integrated circuit device second side to the inner pad in a block 706.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
   a mountable structure having a contact pad and an inner pad exposed through a protective layer of the mountable structure; and
   an integrated circuit device having a linear through channel over the mountable structure with the linear through channel traversing between an integrated circuit device first side and an integrated circuit device second side and with the linear through channel connected through the protective layer to the inner pad, the integrated circuit device first side and the integrated circuit device second side located along outermost boundaries of the integrated circuit device.

2. The system as claimed in claim 1 wherein the mountable structure includes an insulation layer or a semiconductor die.

3. The system as claimed in claim 1 wherein integrated circuit device includes:
   a first integrated circuit; and
   a second integrated circuit over the first integrated circuit.

4. The system as claimed in claim 1 further comprising:
   a carrier with the mountable structure thereover and connected with the contact pad; and
   an encapsulation over the earner and the mountable structure with the linear through channel exposed.

5. The system as claimed in claim 1 further comprising an encapsulation over the mountable structure with the linear through channel exposed with the encapsulation planar with the integrated circuit device first side.

6. The system as claimed in claim 1 wherein:
   the contact pad exposed by the integrated circuit device; and
further comprising:
   a mounting interconnect between the linear through channel exposed on the integrated circuit device second side and the inner pad.

7. The system as claimed in claim 6 further comprising an underfill around the mounting interconnect.

8. The system as claimed in claim 6 wherein the mountable structure includes the protective layer with the contact pad exposed from the protective layer.

9. The system as claimed in claim 6 wherein the integrated circuit device is over the inner pad.

10. The system as claimed in claim 6 further comprising:
    a carrier;
    a packaged module over the carrier with the mountable structure over the packaged module and the contact pad connected to the carrier; and
    an encapsulation over the carrier, the packaged module, and the mountable structure with the linear through channel exposed; and
    a device over the linear through channel.

* * * * *

UNITED STATES PATENT AND TRADEMARK OFFICE
CERTIFICATE OF CORRECTION

PATENT NO. : 8,803,330 B2  
APPLICATION NO. : 12/239774  
DATED : August 12, 2014  
INVENTOR(S) : Huang et al.

Page 1 of 1

It is certified that error appears in the above-identified patent and that said Letters Patent is hereby corrected as shown below:

In the Claims:

Column 8, Claim 4, line 4, delete "the earner" and insert therefor -- the carrier --

Signed and Sealed this
Twenty-second Day of March, 2016

Michelle K. Lee
*Director of the United States Patent and Trademark Office*